United States Patent
Senda et al.

(10) Patent No.: US 11,869,753 B2
(45) Date of Patent: Jan. 9, 2024

(54) PLASMA PROCESSING APPARATUS

(71) Applicant: Tokyo Electron Limited, Tokyo (JP)

(72) Inventors: Takahiro Senda, Miyagi (JP); Yuzo Uemura, Miyagi (JP); Yusei Kuwabara, Miyagi (JP); Tomoya Ujiie, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 98 days.

(21) Appl. No.: 17/502,406

(22) Filed: Oct. 15, 2021

(65) Prior Publication Data

US 2022/0122814 A1 Apr. 21, 2022

(30) Foreign Application Priority Data

Oct. 20, 2020 (JP) .................. 2020-176181

(51) Int. Cl.
*H01J 37/32* (2006.01)

(52) U.S. Cl.
CPC .. *H01J 37/32651* (2013.01); *H01J 37/32568* (2013.01); *H01J 37/32642* (2013.01); *H01J 37/32935* (2013.01)

(58) Field of Classification Search
CPC ........... H01J 37/32651; H01J 37/32568; H01J 37/32642; H01J 37/32935
See application file for complete search history.

(56) References Cited

U.S. PATENT DOCUMENTS

| | | | |
|---|---|---|---|
| 2002/0170676 A1* | 11/2002 | Mitrovic | ........... H01J 37/32082 156/345.47 |
| 2013/0180660 A1* | 7/2013 | Nozawa | ................ G01N 21/55 156/345.24 |
| 2019/0295828 A1* | 9/2019 | Hirayama | ................ H05H 1/46 |

FOREIGN PATENT DOCUMENTS

WO 2018/101065 A1 6/2018

OTHER PUBLICATIONS

[1] C. Stefan, "Dielectric and Conduction Properties of Polyimide Films," Ieeexplore, . https://ieeexplore.ieee.org/stamp/stamp.jsp?arnumber=6095784&tag=1(accessed Dec. 31, 1969). (Year: 2011).*

* cited by examiner

*Primary Examiner* — Henry Luong
(74) *Attorney, Agent, or Firm* — Pearne & Gordon LLP (57) ABSTRACT

A plasma processing apparatus includes a processing chamber; a placing table disposed in the processing chamber to place a substrate thereon; an upper electrode facing the placing table; a member configured to adjust a temperature of the upper electrode; a first sensor provided within the member configured to adjust the temperature of the upper electrode, and configured to measure the temperature of the upper electrode; and a first sheet member, disposed between the upper electrode and the first sensor, having a relative dielectric constant of 2.4 or higher at a frequency of 1 MHz.

7 Claims, 6 Drawing Sheets

PLASMA PROCESSING APPARATUS

CROSS-REFERENCE TO RELATED APPLICATION

This application claims the benefit of Japanese Patent Application No. 2020-176181 filed on Oct. 20, 2020, the entire disclosure of which is incorporated herein by reference.

TECHNICAL FIELD

The various aspects and embodiments described herein pertain generally to a plasma processing apparatus.

BACKGROUND

Patent Document 1, for example, discloses that a temperature sensor is provided in an upper electrode to measure a temperature of the upper electrode.

Patent Document 1: International Publication No. 2018/101065

SUMMARY

In one exemplary embodiment, a plasma processing apparatus includes a processing chamber; a placing table disposed in the processing chamber to place a substrate thereon; an upper electrode facing the placing table; a member configured to adjust a temperature of the upper electrode; a first sensor provided within the member configured to adjust the temperature of the upper electrode, and configured to measure the temperature of the upper electrode; and a first sheet member, disposed between the upper electrode and the first sensor, having a relative dielectric constant of 2.4 or higher at a frequency of 1 MHz.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same parts will be assigned same reference numerals, and redundant description thereof will be omitted.

[Plasma Processing Apparatus]

Figure 1:
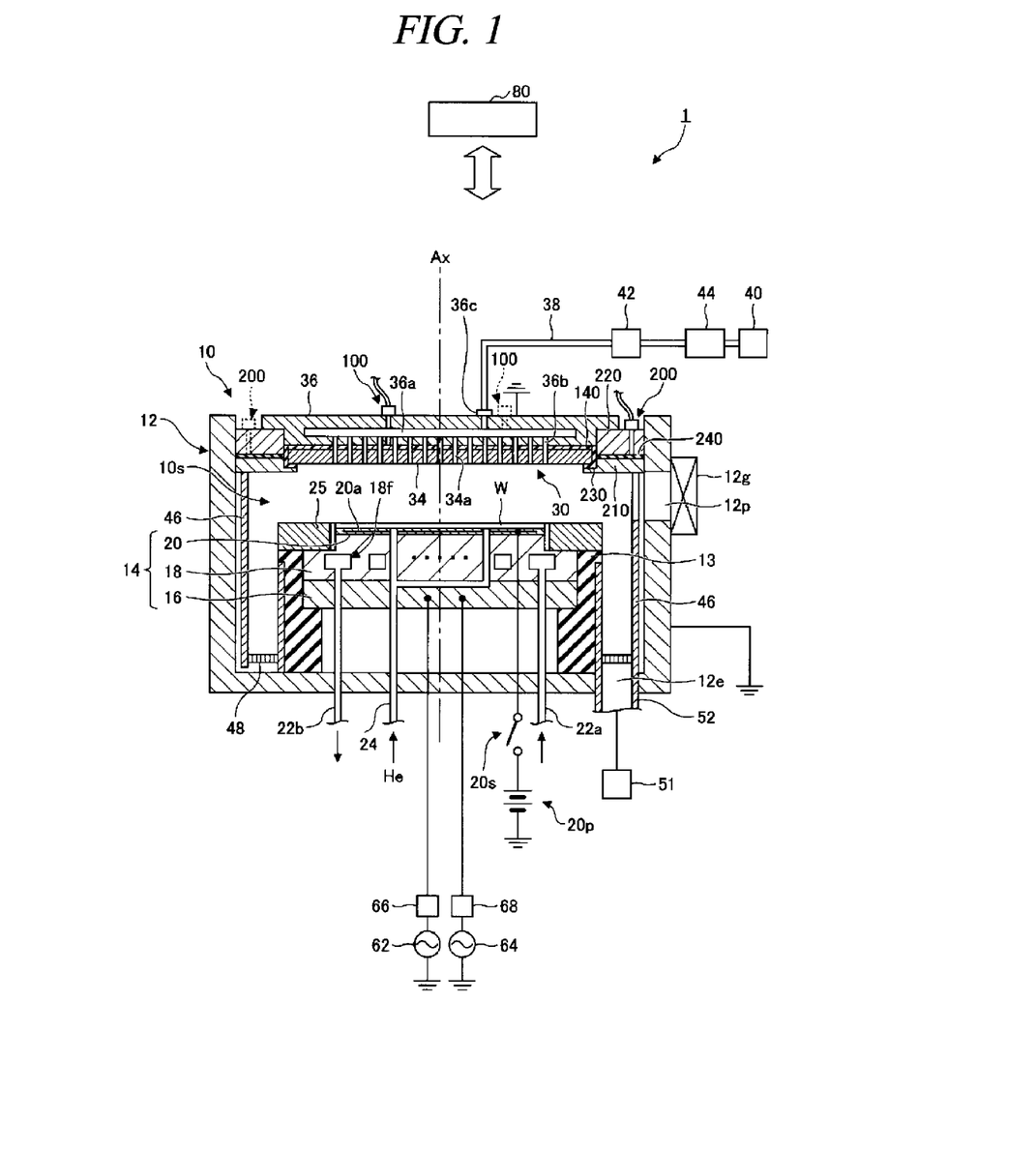
FIG. 1 is a schematic cross sectional view illustrating an example of a plasma processing apparatus according to an exemplary embodiment.

First, an example of a plasma processing apparatus 1 according to an exemplary embodiment will be described with reference to FIG. 1. FIG. 1 is a cross sectional view illustrating an example of the plasma processing apparatus 1 according to the exemplary embodiment. The plasma processing apparatus 1 of FIG. 1 is a capacitively coupled plasma processing apparatus.

The plasma processing apparatus 1 has a chamber 10. The chamber 10 includes a chamber main body 12. The chamber main body 12 has a substantially cylindrical shape. The chamber main body 12 has an internal space 10s therein. The chamber main body 12 is made of, by way of example, but not limitation, aluminum, and the internal space 10s is formed as a processing chamber in which a required plasma processing is performed on a substrate. A corrosion-resistant film is provided on an inner wall surface of the chamber main body 12. This corrosion-resistant film may be made of ceramic such as yttrium oxide or alumina (aluminum oxide), and may be an anodically oxidized film.

A passage 12p is formed in a sidewall of the chamber main body 12. The substrate W passes through the passage 12p when it is transferred between the internal space 10s and the outside of the chamber 10. The passage 12p is opened or closed by a gate valve 12g, which is provided along the sidewall of the chamber main body 12.

A support 13 is provided on a bottom of the chamber main body 12. The support 13 is made of an insulating material. The support 13 has a substantially cylindrical shape. Within the internal space 10s, the support 13 extends upwards from the bottom of the chamber main body 12. An edge ring 25 (also called a focus ring) is provided on the support 13 to surround the substrate. The edge ring 25 may have a substantially cylindrical shape and be made of silicon or the like.

The plasma processing apparatus 1 is further equipped with a placing table 14. The placing table 14 is supported by the support 13. The placing table 14 is disposed within the processing chamber to place the substrate W thereon.

The placing table 14 has a lower electrode 18 and an electrostatic chuck 20. The placing table 14 may be further equipped with an electrode plate 16. The electrode plate 16 is made of a conductor such as, but not limited to, aluminum and has a substantially disk shape. The lower electrode 18 is provided on the electrode plate 16. The lower electrode 18 is made of a conductor such as, but not limited to, aluminum, and has a substantially disk shape. The lower electrode 18 is electrically connected to the electrode plate 16. An outer surface of the lower electrode 18 and an outer surface of the electrode plate 16 are surrounded by the support 13.

The electrostatic chuck 20 is provided on the lower electrode 18. An attraction electrode 20a of the electrostatic chuck 20 is connected to a DC power supply 20p via a switch 20s. If a voltage from the DC power supply 20p is applied to the attraction electrode 20a, the substrate W is held by the electrostatic chuck 20 with an electrostatic attraction force. The electrostatic chuck 20 supports the substrate W and the edge ring 25.

A path 18f is formed within the lower electrode 18. A heat exchange medium (for example, a coolant) is supplied into the path 18f via a pipeline 22a from a chiller unit provided at the outside of the chamber 10. The heat exchange medium supplied into the path 18f is returned back into the chiller unit via a pipeline 22b. In the plasma processing apparatus 1, the temperature of the substrate W placed on the electrostatic chuck 20 is adjusted by a heat exchange between the heat exchange medium and the lower electrode 18.

The substrate processing apparatus 1 is equipped with a gas supply line 24. A heat transfer gas (for example, a He gas) from a heat transfer gas supply device is supplied into a gap between a top surface of the electrostatic chuck 20 and a bottom surface of the substrate W through the gas supply line 24.

The plasma processing apparatus 1 is further equipped with an upper electrode 30 disposed to face the placing table 14. The upper electrode 30 include a ceiling plate 34 and a supporting body 36. The upper electrode 30 is supported at an upper portion of the chamber main body 12 with an annular member 220 therebetween. The annular member 220 is of a circular ring shape, and is made of a material having conductivity. The upper electrode 30 and the annular member 220 close a top opening of the chamber main body 12.

A bottom surface of the ceiling plate 34 is a surface facing the internal space 10s, and it forms and confines the internal space 10s. The ceiling plate 34 may be formed of a low-resistance conductor or semiconductor having low Joule's heat. The ceiling plate 34 is provided with a multiple number of gas discharge holes 34a which are formed through the ceiling plate 34 in a plate thickness direction.

The supporting body 36 is configured to support the ceiling plate 34 in a detachable manner. The supporting body 36 is grounded, and is made of a conductive material such as, but not limited to, aluminum. A gas diffusion space 36a is provided within the supporting body 36. The supporting body 36 is provided with a multiple number of gas holes 36b, which extend downwards from the gas diffusion space 36a. The multiple number of gas holes 36b respectively communicate with the multiple number of gas discharge holes 34a. The supporting body 36 is also provided with a gas inlet opening 36c. The gas inlet opening 36c is connected to the gas diffusion space 36a. A gas supply line 38 is connected to this gas inlet opening 36c.

A gas supply unit including a gas source group 40, a flow rate controller group 44 and a valve group 42 are connected to the gas supply line 38. The gas source group 40 is connected to the gas supply line 38 via the flow rate controller group 44 and the valve group 42. The gas source group 40 includes a plurality of gas sources. The valve group 42 includes a plurality of opening/closing valves. The flow rate controller group 44 includes a plurality of flow rate controllers. Each of the flow rate controllers belonging to the flow rate controller group 44 may be a mass flow controller or a pressure control type flow rate controller. Each of the gas sources belonging to the gas source group 40 is connected to the gas supply line 38 via a corresponding opening/closing valve belonging to the valve group 42 and a corresponding flow rate controller belonging to the flow rate controller group 44.

In the substrate processing apparatus 1, a shield 46 is provided along the inner wall surface of the chamber main body 12 in a detachable manner. The shield 46 is also provided along an outer surface of the support 13. The shield 46 is configured to suppress an etching byproduct from adhering to the chamber main body 12. The shield 46 may be made of, by way of non-limiting example, an aluminum member having a corrosion-resistant film formed on a surface thereof. The corrosion-resistant film may be an oxide film such as yttrium oxide or alumina.

A baffle plate 48 is provided between the support 13 and the sidewall of the chamber main body 12. For example, the baffle plate 48 may be prepared by forming a corrosion-resistant film on a surface of an aluminum member. The corrosion-resistant film may be an oxide film such as yttrium oxide or alumina. The baffle plate 48 is provided with a plurality of through holes. A gas exhaust port 12e is provided at the bottom of the chamber main body 12 under the baffle plate 48. The gas exhaust port 12e is connected with a gas exhaust device 51 via a gas exhaust line 52. The gas exhaust device 51 has a vacuum pump such as a turbo molecular pump.

The substrate processing apparatus 1 is further equipped with a first high frequency power supply 62 configured to apply a high frequency power HF (a power of a high frequency HF) for plasma formation. The first high frequency power supply 62 is configured to generate the high frequency power HF to form plasma from a gas within the chamber 10. The high frequency power HF has a frequency ranging from, e.g., 27 MHz to 100 MHz.

The first high frequency power supply 62 is electrically connected to the electrode plate 16 via a matching device 66. The matching device 66 has a matching circuit. The matching circuit of the matching device 66 is configured to match an impedance at a load side (lower electrode side) of the first high frequency power supply 62 with an output impedance of the first high frequency power supply 62. In another exemplary embodiment, the first high frequency power supply 62 may be electrically connected to the upper electrode 30 via the matching device 66.

The plasma processing apparatus 1 may be further equipped with a second high frequency power supply 64 configured to apply a high frequency power LF (a power of a high frequency LF) for ion attraction. The second high frequency power supply 64 is configured to generate the high frequency power LF. The high frequency power LF has a frequency suitable for attracting, mainly, ions into the substrate W. The frequency of the high frequency power LF may be in the range from, e.g., 400 kHz to 13.56 MHz. Alternatively, the high frequency power LF may be a voltage in a pulse shape having a rectangular waveform.

The second high frequency power supply 64 is electrically connected to the electrode plate 16 via a matching device 68. The matching device 68 has a matching circuit. The matching circuit of the matching device 68 is configured to match an impedance at a load side (lower electrode side) of the second high frequency power supply 64 with an output impedance of the second high frequency power supply 64.

In the plasma processing apparatus 1 having the above-described configuration, assuming that a central axis of the chamber 10 (chamber main body 12) is referred to as an axis Ax, central axes of the placing table 14, the edge ring 25, the upper electrode 30 (the ceiling plate 34 and the supporting body 36), and the annular member 220 substantially coincide with the axis Ax.

The upper electrode 30 is equipped with a first sensor 100 configured to measure a temperature of the upper electrode 30. The first sensor 100 is provided within the supporting body 36. To measure the temperature of the upper electrode 30, a leading end of the first sensor 100 is in contact with a first sheet member 140 which is provided between the supporting body 36 and the ceiling plate 34.

The number of the first sensor 100 may be one or more. For example, a plurality of first sensors 100 may be provided in a circumferential direction around the axis Ax. By way of example, if three first sensors 100 are arranged in the circumferential direction around the axis Ax, temperatures of three points of the upper electrode 30 can be measured. Accordingly, measurement accuracy for the temperature of the upper electrode 30 can be improved based on the three temperature measurement results. Further, if a difference between the three measurement values falls out of a tolerance range, there may be made a determination that the upper electrode 30 has a mounting error.

A ground electrode 210 having a ground potential is provided around the upper electrode 30. Each of the upper electrode 30 and the ground electrode 210 is formed of a conductive member, and an insulating member 230 is provided between the upper electrode 30 and the ground electrode 210 to insulate the upper electrode 30 and the ground electrode 210. The insulating member 230 may be in the form of a sheet.

The annular member 220 is equipped with a second sensor 200 configured to measure a temperature of the ground electrode 210. The second sensor 200 is provided within the annular member 220. To measure the temperature of the ground electrode 210, a leading end of the second sensor 200 is in contact with a second sheet member 240 which is provided between the annular member 220 and the ground electrode 210.

The number of the second sensor 200 may be one or more. For example, a plurality of second sensors 200 may be provided in the circumferential direction around the axis Ax. By way of example, if three second sensors 200 are arranged in the circumferential direction around the axis Ax, temperatures of three points of the ground electrode 210 can be measured. Accordingly, measurement accuracy for the temperature of the ground electrode 210 can be improved based on the three temperature measurement results. Further, if a difference between the three measurement values falls out of a tolerance range, there may be made a determination that the ground electrode 210 has a mounting error.

It is desirable that the high frequency power HF outputted from the first high frequency power supply 62 is applied to the placing table 14 rather than the upper electrode 30. With this configuration, since the high frequency power HF having a high power level is not applied to the upper electrode 30, the measurement accuracy can be improved when the temperature of the upper electrode 30 is measured with the first sensor 100 and/or the second sensor 200.

The plasma processing apparatus 1 may be further equipped with a controller 80. The controller 80 may be a computer including a processor, a storage such as a memory, an input device, a display device, a signal input/output interface, and so forth. The controller 80 controls the individual components of the plasma processing apparatus 1. In the controller 80, an operator may input a command or the like to manage the plasma processing apparatus 1 through the input device. Further, in the controller 80, an operational status of the plasma processing apparatus 1 may be visually displayed by the display device. A control program and recipe data are stored in the storage of the controller 80. The control program is executed by the processor of the controller 80 to implement various processings in the plasma processing apparatus 1. The processor of the controller 80 executes the control program and controls the individual components of the plasma processing apparatus 1 according to the recipe data, so that various processes, for example, a plasma processing method is carried out in the plasma processing apparatus 1.

Figure 2A:
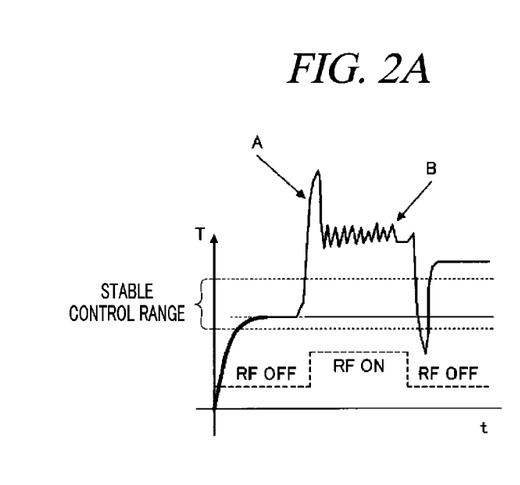
FIG. 2A and FIG. 2B are diagrams illustrating a problem of temperature measurement and an example of a temperature measurement result according to the exemplary embodiment.
Figure 2B:
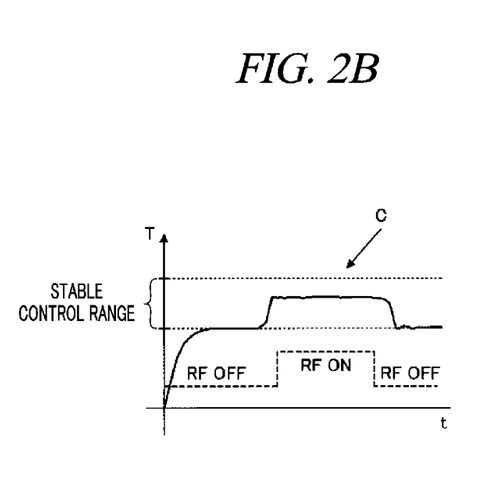

Now, referring to FIG. 2A, a problem of temperature measurement of the upper electrode 30 will be explained. FIG. 2A is a diagram illustrating the problem of the temperature measurement of the upper electrode 30, and FIG. 2B is a diagram illustrating an example of a temperature measurement result by the first sensor 100 and/or the second sensor 200 according to the exemplary embodiment.

Although the plasma processing apparatus 1 according to the present exemplary embodiment includes the first sheet member 140 and the second sheet member 240 as shown in FIG. 1, a conventional plasma processing apparatus does not have the first sheet member 140 and the second sheet member 240. Accordingly, in the conventional plasma processing apparatus, plasma formed under the upper electrode 30 may enter a gap between the upper electrode 30 and the ground electrode 210, and if a RF discharge occurs in this gap, the first sensor 100 and the second sensor 200 are directly affected by this space discharge. As a result, each sensor may not be able to measure the temperature during the process stably, resulting in deterioration of the measurement accuracy.

Particularly, in a recent process such as HARC (High Aspect Ratio Contact), a power level of a high frequency power RF (HF, LF) applied to a plasma processing apparatus tends to increase, and a processing time of the substrate W also tends to increase. As a result, as depicted in FIG. 2A, a temperature T measured by the first sensor 100 and the second sensor 200 suddenly takes a high value at the moment the high frequency power RF is applied (at the start of RF ON) (A of FIG. 2A). Even after, while the high frequency power RF is being applied (during a period of RF ON), the temperature measured by the first sensor 100 and the second sensor 200 exceeds a previously set stable control range and becomes instable (B of FIG. 2A). As stated, since the space discharge is highly likely to occur in the vicinity or inside the upper electrode 30 due to the high power level of the high frequency power RF or the like, the temperature measurement values of the upper electrode 30 and the ground electrode 210 may include a noise and may be difficult to stabilize.

To solve the problem, it is required to maintain the condition of the processing chamber for each substrate W in order to further stabilize the environment at the time of measuring the temperature of the upper electrode 30 and the vicinity thereof, and required to perform a control over the process appropriately based on the temperature measurement results.

To achieve this solution, in the plasma processing apparatus 1 according to the present exemplary embodiment, the first sheet member 140 and the second sheet member 240 are provided. In the following, referring to FIG. 3, the structure of the upper electrode 30 and the vicinity thereof will be described in further detail according to the exemplary embodiment.

Figure 3:
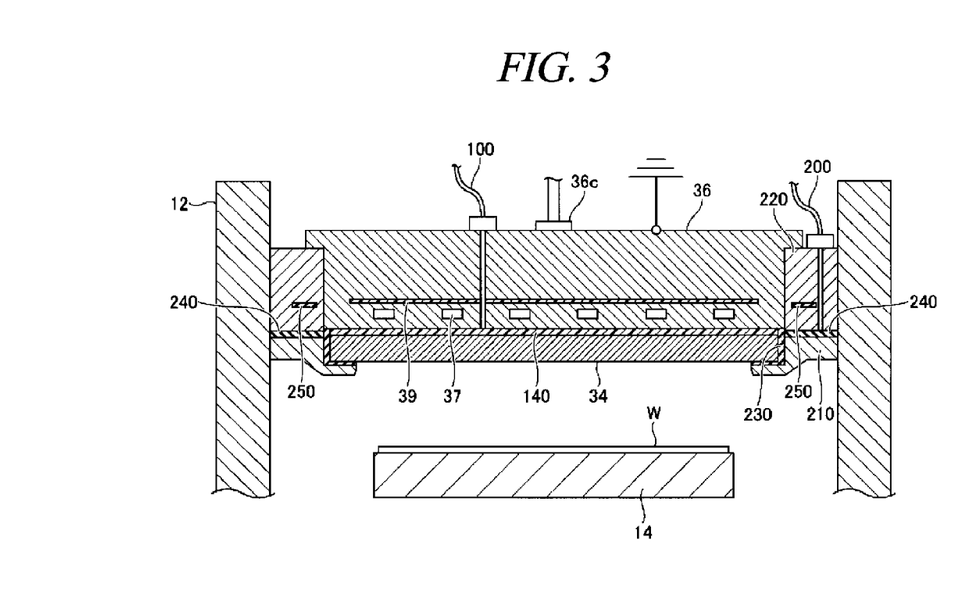
FIG. 3 is a diagram illustrating an example structure of an upper electrode and the vicinity thereof according to the exemplary embodiment.

The first sheet member 140 is disposed between the upper electrode 30 (ceiling plate 34) and the firs sensor 100, and is made of a high capacitance material with a relative dielectric constant of 2.4 or higher at a frequency of 1 MHz. Accordingly, the leading end of the first sensor 100 is not in direct contact with the ceiling plate 34. The first sheet member 140 suppresses a plasma discharge by reducing a potential difference between the ceiling plate 34 and the supporting body 36, and suppresses a direct flow of a high frequency current to each sensor, thus substantially removing a noise caused by the high frequency current. As a result, the environment when measuring the temperature by the first sensor 100 is stabilized, which enables to improve the measurement accuracy for the temperature.

The first sheet member 140 is formed of a member having a withstand voltage characteristic. For example, if the first sheet member 140 is made of a fluorine-containing material, it is desirable that the fluorine-containing material is a high capacitance material with a relative dielectric constant of 2.4 or higher at a frequency of 1 MHz. As another example, if the first sheet member 140 is made of a silicon-containing material, it is desirable that the silicon-containing material is a high capacitance material with a relative dielectric constant of 4.0 or higher at a frequency of 1 MHz.

The second sheet member 240 is disposed between the ground electrode 210 and the second sensor 200, and is made of a high capacitance material with a relative dielectric constant of 2.4 or higher at a frequency of 1 MHz. The second sheet member 240 has the same function and effect as the first sheet member 140.

The second sheet member 240 is formed of a member having a withstand voltage characteristic. For example, if the second sheet member 240 is made of a fluorine-containing material, it is desirable that the fluorine-containing material is a high capacitance material with a relative dielectric constant of 2.4 or higher at a frequency of 1 MHz. As another example, if the second sheet member 240 is made of a silicon-containing material, it is desirable that the silicon-containing material is a high capacitance material with a relative dielectric constant of 4.0 or higher at a frequency of 1 MHz.

A path 37 is formed in the supporting body 36. Further, a heater 39 is embedded in the supporting body 36. A heat transfer medium (for example, a coolant) is supplied into the path 37 from a chiller unit provided at the outside of the chamber 10. The heat transfer medium is circulated through the path 37 and returned back into the chiller unit. In the plasma processing apparatus 1, a temperature of the ceiling plate 34 is adjusted by a heat exchange between the ceiling plate 34, and the heater 39 and the heat exchange medium supplied into the path 37.

A heater 250 is embedded in the annular member 220. The temperature of the ground electrode 210 is adjusted by heating with the heater 250. Further, a path may be formed within the annular member 220. With this configuration, the temperature of the ground electrode 210 is adjusted.

Both the supporting body 36 and the annular member 220 are formed of a conductive member. In the present exemplary embodiment, although the supporting body 36 and the annular member 220 are provided as separate bodies, they may be provided as a single body. The supporting body 36 is an example of a member configured to adjust a temperature of the upper electrode 30. The annular member 220 is an example of a member configured to adjust the temperature of the ground electrode 210.

The temperature of the upper electrode 30 measured by the first sensor 100 and the temperature of the ground electrode 210 measured by the second sensor 200 are sent to the controller 80. The controller 80 controls heating temperatures of the heaters 39 and 250 and the temperature of the heat exchange medium supplied into the path 37 based on the measured temperatures of the upper electrode 30 and the ground electrode 210 such that the temperatures of the upper electrode 30 and the ground electrode 210 reach target temperatures.

[Temperature Sensor]

Figure 4:
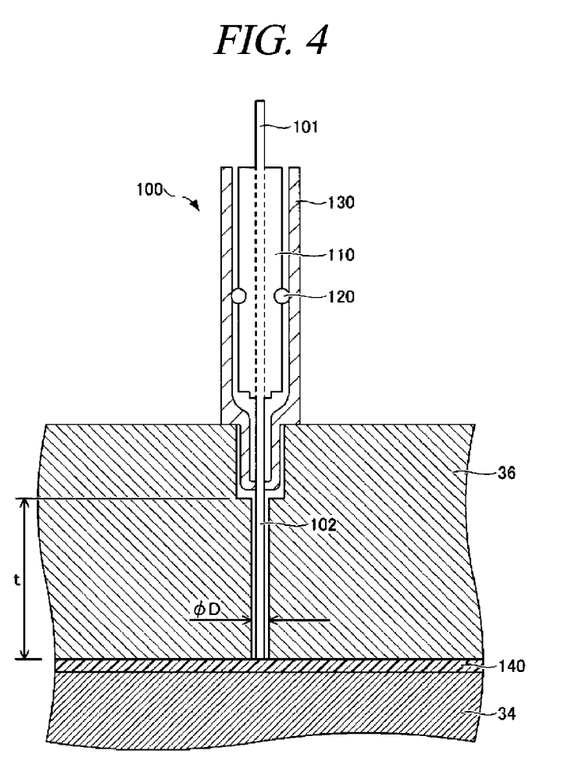
FIG. 4 is a diagram illustrating an example temperature sensor according to the exemplary embodiment.

Now, a temperature sensor according to the present exemplary embodiment will be discussed with reference to FIG. 4. FIG. 4 is a diagram illustrating an example of a temperature sensor according to the exemplary embodiment. In FIG. 4, a configuration of the first sensor 100 will be described as an example of the temperature sensor. Since the second sensor 200 has the same configuration as the first sensor 100, description thereof will be omitted.

The first sensor 100 has a sensor element 110, a shield member 130, a ring-shaped member 120, and a shield cable 101. The sensor element 110 is surrounded by the shield member 130 having a cylindrical shape. The shield member 130 is formed of a conductive material and has a ground potential. The sensor element 110 is formed of platinum, and is connected to the shield cable 101 therein. The shield cable 101 may be inserted within the sensor element 110. The shield element 101 is a conductor.

A leading end of the shield member 130 has a diameter smaller than that of a body portion thereof, and is inserted in a recess formed in the supporting body 36. The sensor element 110 is thick at a base end (body portion) of the shield member 130, tapers in the leading end of the shield member 130, passes through a hole formed at the leading end of the shield member 130, passes through a through hole formed in the supporting body 36, and comes into contact with the first sheet member 140.

When plasma enters the upper electrode 30, a discharge (RF discharge) by the high frequency powers HF and LF may occur in a space within the upper electrode 30. In the space within the upper electrode 30, a discharge may occur in a space of a required pressure and a required distance according to Paschen's law. If the sensor element 110 receives the discharge directly, a noise may be generated in the temperature measurement value obtained by the sensor element 110, resulting in deterioration of the temperature measurement accuracy. To avoid this, the first sheet member 140 made of the high capacitance material having the relative dielectric constant of 2.4 or higher at the frequency of 1 MHz is provided between the first sensor 100 and the ceiling plate 34. Accordingly, the high frequency current is attenuated by the first sheet member 140. Due to this shield effect of the first sheet member 140, the first sensor 100 is not directly affected by the discharge. Therefore, by reducing external factors at the time of measuring the temperature of the upper electrode 30, the temperature measurement accuracy can be improved.

Further, in the first sensor 100, a discharge occurs not only on the sensor element 110 side, but also on the shield member 130 side. Since, however, the shield member 130 is formed of a conductive material and has a ground potential, the influence of the discharge can be suppressed by guiding the high frequency current flowing in the shield member 130 to the ground.

Furthermore, the ring-shaped member 120 is disposed between the sensor element 110 and the shield member 130 to seal a gap therebetween. The ring-shaped member 120 may be a silicon-containing structure or a carbon-containing structure.

The ring-shaped member 120 may be formed of, for example, a conductive resin. If the high frequency current reaches the gap between the sensor element 110 and the shield member 130, the discharge may occur between the sensor element 110 and the shield member 130. As a result, the noise may be generated in the temperature measurement value obtained by the sensor element 110, as stated above, which results in deterioration of the temperature measurement accuracy. Thus, to avoid this, the flow of the high frequency current is blocked by the ring-shaped member 120.

Figure 5:
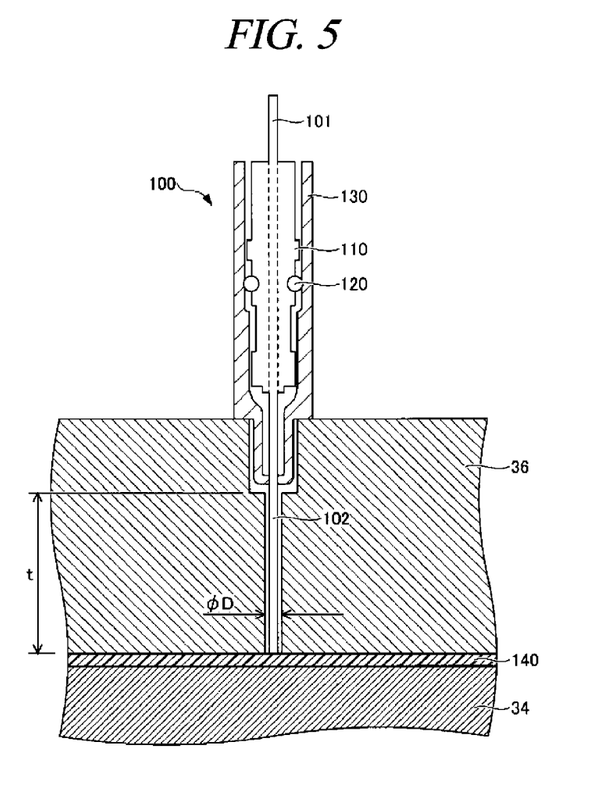
FIG. 5 is a diagram illustrating another example temperature sensor according to the exemplary embodiment.

FIG. 5 is a diagram illustrating another example of the temperature sensor according to the exemplary embodiment. Here as well, although the first sensor 100 is taken as an example, the second sensor 200 may also have the configuration of FIG. 5.

The first sensor 100 of FIG. 5 is different from the first sensor 100 of FIG. 4 in that the shield member 130 has a labyrinth structure in the first sensor 100 of FIG. 5. In the example of FIG. 5, by providing irregularities on at least one of an inner wall of the shield member 130 or an outer wall of the sensor element 110, the inside of the shield member 130 has the labyrinth structure. With this labyrinth structure, by setting a condition in which the space discharge is difficult to generate within the shield member 130 based on Paschen's law, it is possible to further suppress the degradation of the temperature measurement accuracy due to the discharge. Since the other configurations of the first sensor 100 are the same as those of FIG. 4, redundant description thereof will be omitted.

[Shield Effect]

Figure 6A:
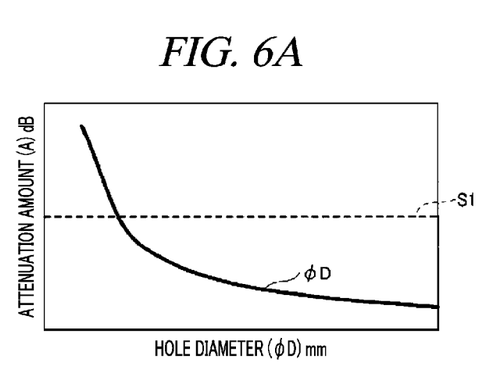
FIG. 6A and FIG. 6B are diagrams for describing a shield effect by a sheet member according to the exemplary embodiment.
Figure 6B:
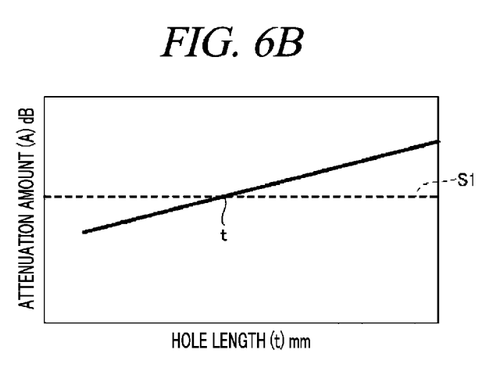

The shield effect by the first sheet member 140 and the second sheet member 240 will be explained with reference to FIG. 6A and FIG. 6B. FIG. 6A and FIG. 6B are diagrams for describing the shield effect by the first sheet member 140 and the second sheet member 240.

A horizontal axis of FIG. 6A indicates a diameter φD (mm) of the through hole (shown in FIG. 4 and FIG. 5) through which the sensor element 110 passes, and a vertical axis indicates an attenuation amount A (dB). A horizontal axis of FIG. 6B indicates a length t (mm) of the through hole (shown in FIG. 4 and FIG. 5) through which the sensor element 110 passes, and a vertical axis indicates the attenuation amount A (dB).

The attenuation amount A is represented by expression (1).

[Expression 1]

$$A = 20\log_{10}\left(\frac{\alpha\lambda}{\phi D^3}\right) + \frac{\beta \cdot t}{\phi D} \quad \text{Expression 1}$$

In the expression (1), α and β are integers, and λ denotes a wavelength of the high frequency power HF or LF. The attenuation amount A is an index of the shield effect of the first sheet member 140 and the second sheet member 240, that is, an index of the effect of blocking the high frequency current. The larger the attenuation amount A is, the higher the effect of blocking the high frequency current may be.

When the frequency of the high frequency power HF is 40 MHz, the wavelength λ becomes about 7.5 m, and when the frequency of the high frequency power LF is 400 kHz, the wavelength λ becomes about 750 m. From the expression (1), the attenuation amount A obtained when the wavelength of the high frequency power HF is put into λ in the expression (1) becomes smaller than the attenuation amount A obtained when the wavelength of the high frequency power LF is put into λ in the expression (1).

Therefore, the attenuation amounts A of the first sheet member 140 and the second sheet member 240 are calculated by using, between the high frequency powers HF and LF, the wavelength λ of the high frequency power HF under a stricter condition with a smaller value of the shield effect (attenuation amount A). The calculated attenuation amount A is used as the index of the shield effect.

If the attenuation amount A shown in FIG. 6A exceeds a predetermined threshold value S1, the RF discharge can be suppressed by the shield effect of the first sheet member 140 and the second sheet member 240. That is, the threshold value S1 represents the attenuation amount A capable of suppressing the RF discharge. Thus, the diameter φD of the through hole is designed such that the attenuation amount A becomes larger than the threshold value S1.

In addition, when the attenuation amount A shown in FIG. 6B exceeds the predetermined threshold value S1, the RF discharge can be suppressed by the shield effect of the first sheet member 140 and the second sheet member 240. Thus, the length t of the through hole is designed such that the attenuation amount A becomes larger than the threshold value S1. It is desirable that both the diameter φD of the through hole and the length t of the through hole exceed the threshold value S1. With this configuration, the discharge can be suppressed by the first sheet member 140 and the second sheet member 240.

Reference is made to FIG. 2B, which shows the temperature measurement result obtained by the first sensor 100 and/or the second sensor 200 in the configuration where the first sheet member 140 and the second sheet member 240 are provided. As can be seen from FIG. 2B, according to the plasma processing apparatus 1 of the present exemplary embodiment, the temperature T measured by the first sensor 100 (the second sensor 200) falls within the stable control range while the high frequency power RF is being applied (during the period of RF ON) and is stable (C of FIG. 2B). As described above, with this configuration of the upper electrode 30 and the vicinity thereof according to the present embodiment, the temperature measurement accuracy of the upper electrode 30 can be improved.

It should be noted that the plasma processing apparatus according to the above-described exemplary embodiments are illustrative in all aspects and are not anyway limiting. The above-described exemplary embodiments can be modified and improved in various ways without departing from the scope and the spirit of claims. Unless contradictory, other configurations may be adopted, and the disclosures in the various exemplary embodiments can be combined appropriately.

For example, although the plasma processing apparatus has been described as an example of the plasma processing apparatus, the plasma processing apparatus may not be limited to the plasma processing apparatus as long as it is an apparatus configured to perform a preset processing (for example, a film forming processing, an etching processing, etc.) on a substrate.

The plasma processing apparatus of the present disclosure may be applicable to any of various types of apparatuses such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus.

According to the exemplary embodiment, it is possible to improve the measurement accuracy for the temperature of the upper electrode or the vicinity thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing apparatus, comprising:
a processing chamber;
a placing table disposed in the processing chamber to place a substrate thereon;
an upper electrode facing the placing table;
a first member configured to adjust a temperature of the upper electrode;
a first sensor provided within the first member and configured to measure the temperature of the upper electrode; and
a first sheet member, disposed between the upper electrode and the first sensor, having a relative dielectric constant of 2.4 or higher at a frequency of 1 MHz, wherein a leading end of the first sensor is in contact with the first sheet member;
a ground electrode, disposed around the upper electrode, having a ground potential;
a second member configured to adjust a temperature of the ground electrode;
a second sensor provided within the second member and configured to measure the temperature of the ground electrode; and
a second sheet member, disposed between the ground electrode and the second sensor, having a relative dielectric constant of 2.4 or higher at a frequency of 1 MHz, wherein a leading end of the second sensor is in contact with the second sheet member.

2. The plasma processing apparatus of claim 1, wherein the first sensor and/or the second sensor are surrounded by a shield member formed of a conductor.

3. The plasma processing apparatus of claim 2, wherein the shield member has a labyrinth structure inside.

4. The plasma processing apparatus of claim 2, wherein the shield member has a ground potential.

5. The plasma processing apparatus of claim 2, further comprising:
a conductive ring-shaped member which seals a gap between the shield member and the first sensor and/or the second sensor.

6. The plasma processing apparatus of claim 1, wherein a diameter φD of a through hole through which a leading end of the first sensor provided in the first member passes and/or a through hole through which a leading end of the second sensor provided in the second member passes, and a length t of the through hole are designed such that an attenuation amount (A) calculated from a following expression (1) becomes equal to or larger than a preset threshold value:

[Expression 1]

$$A = 20\log_{10}\left(\frac{\alpha\lambda}{\phi D^3}\right) + \frac{\beta \cdot t}{\phi D}. \qquad \text{Expression 1}$$

7. The plasma processing apparatus of claim 1, wherein the first sensor includes multiple first sensors and the second sensor includes multiple second sensors, and the multiple first sensors and/or the multiple second sensors are arranged in a circumferential direction.

* * * * *